(12) United States Patent
Imai et al.

(10) Patent No.: US 7,151,288 B2
(45) Date of Patent: Dec. 19, 2006

(54) SEMICONDUCTOR DEVICE AND METHOD OF MANUFACTURING THE SAME

(75) Inventors: Keitaro Imai, Yokohama (JP); Koji Yamakawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/678,061

(22) Filed: Oct. 6, 2003

(65) Prior Publication Data
US 2004/0130026 A1    Jul. 8, 2004

(30) Foreign Application Priority Data
Oct. 7, 2002   (JP)   ............... 2002-293902

(51) Int. Cl.
*H01L 29/51*   (2006.01)
(52) U.S. Cl. .............. 257/295; 257/296; 257/306; 257/758; 438/238; 438/244; 438/3
(58) Field of Classification Search ............. 257/758, 257/774, 750, 763, 754, 756, E21.664, E27.104, 257/306, 295, 296; 438/238, 244, 3
See application file for complete search history.

(56) References Cited

U.S. PATENT DOCUMENTS

| | | | |
|---|---|---|---|
| 5,554,866 A * | 9/1996 | Nishioka et al. | ............ 257/295 |
| 6,346,741 B1 * | 2/2002 | Van Buskirk et al. | ...... 257/664 |
| 6,656,830 B1 * | 12/2003 | Subramanian et al. | ....... 438/618 |
| 6,680,514 B1 * | 1/2004 | Geffken et al. | ............. 257/368 |
| 6,693,356 B1 * | 2/2004 | Jiang et al. | .................. 257/767 |
| 6,744,090 B1 * | 6/2004 | Kim | ........................... 257/301 |
| 6,767,769 B1 * | 7/2004 | Hawley et al. | ............. 438/131 |

FOREIGN PATENT DOCUMENTS

| | | | |
|---|---|---|---|
| JP | 07030111 A | * | 1/1995 |
| JP | 9-252095 | | 9/1997 |
| JP | 2001-267516 | | 9/2001 |
| JP | 2002-289810 | | 10/2002 |
| JP | 2002289810 A | * | 10/2002 |

OTHER PUBLICATIONS

Periodic Table of the Elements—, date unknown.*

* cited by examiner

*Primary Examiner*—Kenneth Parker
*Assistant Examiner*—Chris C. Chu
(74) *Attorney, Agent, or Firm*—Oblon, Spivak, McClelland, Maier & Neustadt, P.C.

(57) ABSTRACT

A semiconductor device comprises a semiconductor substrate, a conductive plug electrically connected to the semiconductor substrate, a silicon carbide film provided on the conductive plug, a metal compound film provided on the silicon carbide film and containing a metal carbide, and an electrode provided on the metal compound film.

8 Claims, 14 Drawing Sheets

US 7,151,288 B2

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2002-293902, filed Oct. 7, 2002, the entire contents of which are incorporated herein by reference.

BACKGROUND OF THE INVENTION

1. Field of the Invention

The present invention relates to a semiconductor device and a method of manufacturing the same, more particularly, relates to a semiconductor device in which a connected portion between a capacitor using a ferroelectric material or a highly dielectric material and a plug formed under the capacitor is improved, and a method of manufacturing the same.

2. Description of the Related Art

In recent years, development of a ferroelectric memory which is a nonvolatile memory using a ferroelectric thin film has been advanced. In order to miniaturize a cell of the ferroelectric memory and increase its capacitance, a capacitor on plug (COP) structure has been considered.

FIG. 8 shows a conventional COP structure. In the drawing, reference numeral 81 denotes a silicon substrate, 82 denotes a source/drain diffusion layer of a MOS transistor, 83 denotes a silicon oxide film, 84 denotes a silicon nitride film, 85 denotes a plug formed of tungsten (W) or polycrystalline silicon, 86 denotes a capacitor lower electrode formed of platinum (Pt), 87 denotes a PZT ($PbZr_xTi_{1-x}O_3$) film (capacitor dielectric film), and 88 denotes a capacitor upper electrode formed of Pt.

In the COP structure, a capacitor is provided on the plug 85 connected to the source/drain diffusion layer 82 of the MOS transistor, and a cell size can be reduced in the same manner as in a stacked capacitor of a DRAM.

In a process of this type of COP structure, after the plug 85 is formed, heat treatment is carried out a plurality of times under an oxidizing atmosphere. As one example, there is a heat treatment at a high temperature of about 600° C. or more, for crystallizing the PZT film 87 formed in an amorphous form. A reason why the PZT film 87 is crystallized is that ferroelectric materials such as PZT do not develop ferroelectricity in an amorphous state.

Other examples of the heat treatment under the oxidizing atmosphere after the plug 85 is formed include: a treatment for recovering damage of the capacitor caused by reactive ion etching (RIE) processing in an integration process of the capacitor, that is, damage caused in the PZT film 87 at a time when the PZT film formed on the whole surface is RIE-processed to form the PZT film 87; and a heat treatment for recovering the damage by plasma in a reducing atmosphere at the time of forming an interlayer insulating film in CVD in a process for forming the film in the CVD for an $SiO_2$ hard mask for RIE processing.

A reason why the heat treatment for crystallizing the PZT film 87 or for recovering the damage is carried out under the oxidizing atmosphere is that oxygen deficit of the PZT film 87 accompanying the heat treatment is inhibited.

Here, Pt which is the material of the capacitor lower electrode 86 does not have an oxygen barrier property. Therefore, when W is used as the material of the plug 85 in the heat treatment under the oxidizing atmosphere, the plug 85 is oxidized by oxygen permeated in the capacitor lower electrode 86 to form W oxide. Accordingly, contact between the plug 85 and the capacitor lower electrode 86 becomes defective, or a plug structure itself is destroyed by volume expansion of the plug 85, and the capacitor peels. On the other hand, when polycrystalline Si is used as the material of the plug 85, Si oxide is formed, and therefore a contact defect is similarly generated.

Therefore, it has been proposed that oxidation of the plug 85 be prevented by a barrier layer formed of TiAlN, TiN, and TaSiN. However, this type of barrier layer has a film thickness of about 100 nm or more, and is a factor for hindering miniaturization.

This problem also exists in a stacked DRAM which takes a process of forming a capacitor after forming the plug and in which highly dielectric materials such as $Ta_2O_5$ and $(Ba,Sr)TiO_3$ are used in a capacitor dielectric film.

BRIEF SUMMARY OF THE INVENTION

A semiconductor device according to an aspect of the present invention comprises a semiconductor substrate; a conductive plug electrically connected to the semiconductor substrate; a silicon carbide film provided on the conductive plug; a metal compound film provided on the silicon carbide film and containing a metal carbide; and an electrode provided on the metal compound film.

A semiconductor device according to another aspect of the present invention comprises a semiconductor substrate; a conductive plug electrically connected to the semiconductor substrate; a silicon carbide film provided on the conductive plug; a metal compound film provided on the silicon carbide film and containing a metal carbide; a capacitor lower electrode provided on the metal compound film; a capacitor upper electrode provided above the capacitor lower electrode; and a capacitor dielectric film provided between the capacitor lower electrode and the capacitor upper electrode and containing a ferroelectric material or a highly dielectric material as a major component.

A method of manufacturing a semiconductor device according to an aspect of the present invention comprises preparing a semiconductor substrate;

forming a conductive plug electrically connected to the semiconductor substrate; forming a silicon carbide film covering an upper surface of the conductive plug; forming a first metal film on the silicon carbide film; forming a second metal film on the first metal film; forming a dielectric film containing a ferroelectric material or a highly dielectric material which is a major component on the second metal film; and forming a metal compound film on the silicon carbide film by heat treatment in an oxidizing atmosphere, the metal compound film comprising a metal carbide of a metal contained in the first metal film and carbon.

DETAILED DESCRIPTION OF THE INVENTION

Embodiments of the present invention will be described hereinafter with reference to the drawings.

(First Embodiment)

FIGS. 1A to 1K are sectional views showing a manufacturing process of a COP type FeRAM cell according to a first embodiment of the present invention.

In the present embodiment, a COP type FeRAM cell will be described. In the cell, a W plug is provided under a capacitor, and a laminate film (barrier layer) of a thin silicon carbide film and a thin titanium nitride film is provided between the W plug and a capacitor lower electrode (iridium film).

Figure 1A:
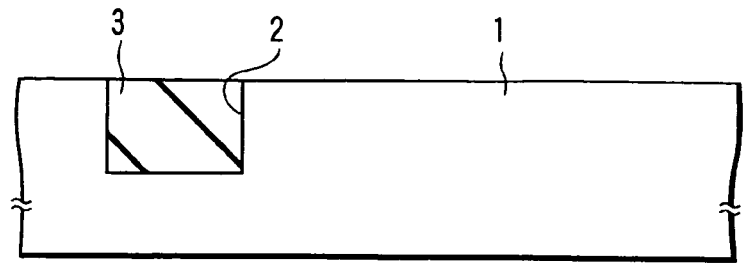
FIGS. 1A to 1K are sectional views showing a manufacturing process of a COP type FeRAM cell according to a first embodiment of the present invention.

First, as shown in FIG. 1A, a shallow trench 2 is formed in the surface of a p-type silicon substrate 1, and subsequently an insulating film 3 such as an SiO$_2$ film is buried in the trench 2 to separate devices by shallow trench isolation (STI).

Figure 1B:
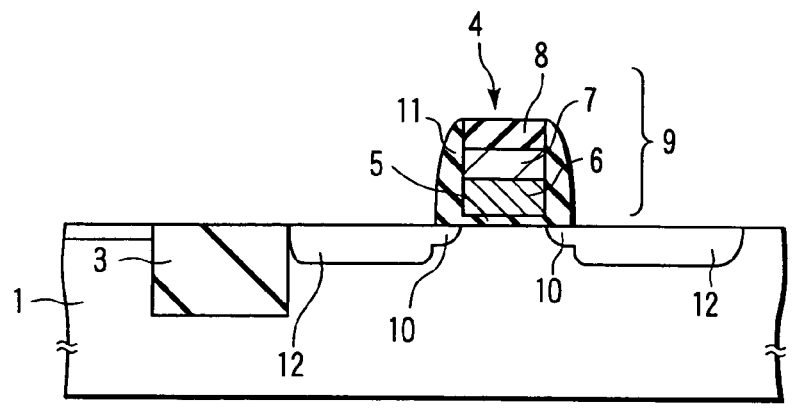

Next, as shown in FIG. 1B, a MOS transistor 4 for performing a switch operation is formed. The MOS transistor 4 is formed, for example, by the following process.

First, the p-type silicon substrate 1 is prepared, and a thin silicon oxide film (gate insulating film) 5 having a thickness of about 6 nm is formed on the exposed surface of p-type silicon substrate 1, for example, by thermal oxidation. Next, an n-type polycrystalline silicon film 6 doped with arsenic and having a high concentration of impurities is formed on the whole surface. Subsequently, a tungsten silicide film 7 and a silicon nitride film (gate upper insulating film) 8 are successively formed on the n-type polycrystalline silicon film 6. Thereafter, the silicon nitride film 8, tungsten silicide film 7, and n-type polycrystalline silicon film 6 are processed by usual photolithography and RIE to form a gate electrode 9.

Next, the gate upper insulating film 8 is used as a mask to ion-implant n-type impurities in the surface of the substrate, and subsequently the n-type impurities are activated by annealed to form an extension (shallow source/drain diffusion layer) 10. It is to be noted that the activation anneal may be omitted and replaced with a substitute activation anneal at a time when a source/drain diffusion layer 12 is formed in the next step.

Next, a silicon nitride film forming a gate side wall insulating film (spacer) 11 is formed on the whole surface so as to coat the side surface of the gate electrode 9. Subsequently, the whole surface of the silicon nitride film is etched by RIE process, and the gate side wall insulating film 11 is formed on the side wall of the gate electrode 9. Subsequently, the gate side wall insulating film 11 and gate upper insulating film 8 are used as masks to ion-implant the n-type impurities into the surface of the substrate. Subsequently, the n-type impurities are activated by anneal to form the source/drain diffusion layer 12 so that the MOS transistor 4 is obtained.

Figure 1C:
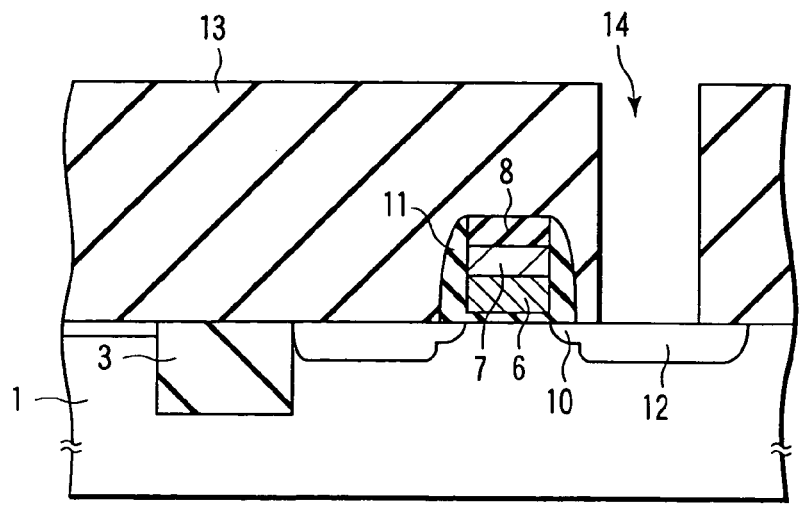

Next, a silicon oxide film is formed on the whole surface by a CVD process, and subsequently the silicon oxide film is polished by a CMP process. Accordingly, as shown in FIG. 1C, a silicon oxide film 13 whose surface is flat is formed. Thereafter, a contact hole 14 reaching the source/drain diffusion layer 12, which is not to be connected to the capacitor, is opened in the silicon oxide film 13.

Figure 1D:
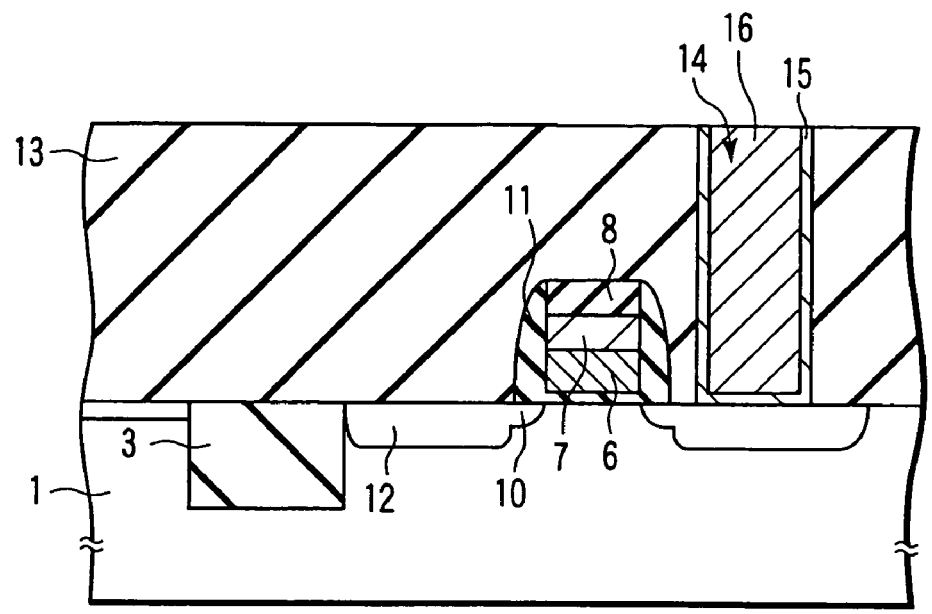

Next, as shown in FIG. 1D, a W plug 16 is buried/formed in the contact hole 14 via a titanium nitride film 15. A concrete method of forming the titanium nitride film 15 and W plug 16 is as follows.

First, a thin titanium film (not shown) is formed by a sputter or CVD process so as to coat side and bottom surfaces of the contact hole 14. Next, the heat treatment is carried out in a nitrogen-containing forming gas. Accordingly, the titanium film is replaced with a titanium nitride film with which the side and bottom surfaces of the contact hole 14 are coated. Subsequently, a W film is formed on the whole surface by the CVD process so as to fill in the contact hole 14. Moreover, unnecessary titanium nitride film and W film outside the contact hole 14 are removed, for example, by the CMP process, and a plug structure including the titanium nitride film 15 and W plug 16 is obtained.

Figure 1E:
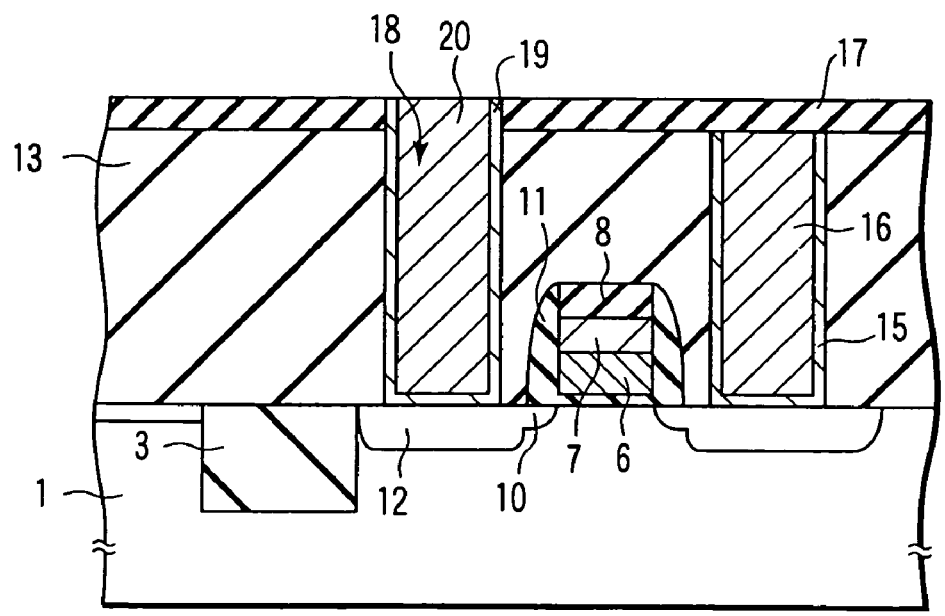

Next, as shown in FIG. 1E, a silicon nitride film 17 is formed on the whole surface by the CVD process, and a contact hole 18 reaching the source/drain diffusion layer 12 which is to be connected to the capacitor is opened in the silicon nitride film 17 and silicon oxide film 13.

Thereafter, as shown in FIG. 1E, in the same manner as in the step of FIG. 1D, a W plug 20 is buried and formed in the contact hole 18 via a titanium nitride film 19. A concrete method for forming the titanium nitride film 19 and W plug 20 is the same as that for the titanium nitride film 15 and W plug 16.

Figure 1F:
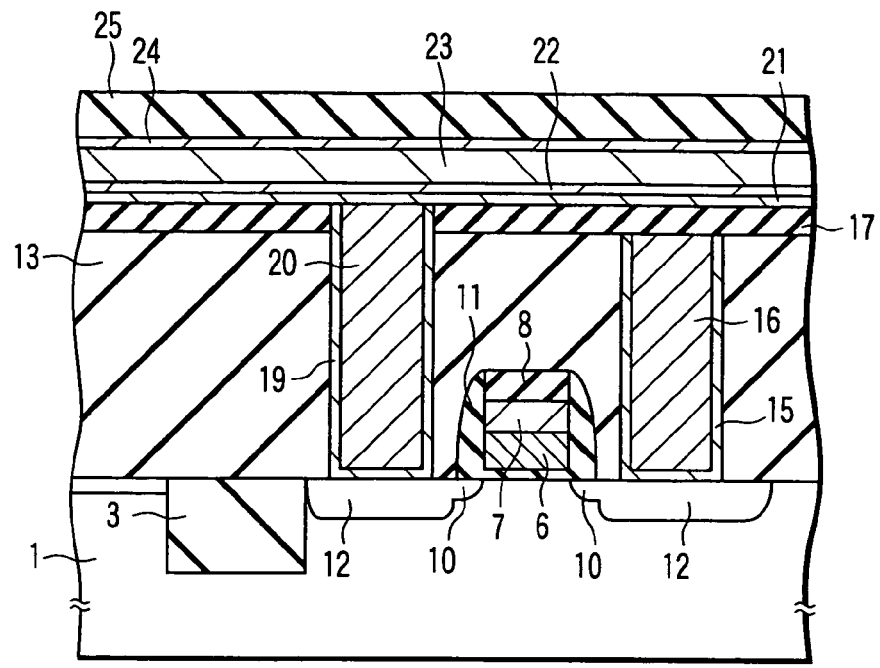

Next, as shown in FIG. 1F, a thin silicon carbide film (SiC film) 21 having a thickness of 10 nm or less is formed on the whole surface by the sputter process. Subsequently, a thin titanium film 22 having a thickness of about 2.5 nm, a 30 nm thick iridium film 23 and 20 nm thick first platinum film 24 forming a capacitor lower electrode, and a PZT film 25 forming a capacitor dielectric film are successively formed on the SiC film 21 by the sputter process. A film structure of the PZT film 25 in this stage is amorphous.

Instead of the titanium film 22, a zirconium film, hafnium film, vanadium film, niobium film, or tantalum film may also be formed. The SiC film 21 and titanium film 22 may also be formed by the CVD process.

The zirconium film may also be formed by either the sputter process or the CVD process. In general, when the capacitor includes a relatively flat capacitor structure, handling in the sputter process is possible. However, when miniaturization advances, and a steric shape is taken, the CVD process can be said to be more appropriate. It is to be noted that the formation of the SiC film 21 and titanium film 22 is not limited to the sputter process or the CVD process, and another method can appropriately be used.

Figure 1G:
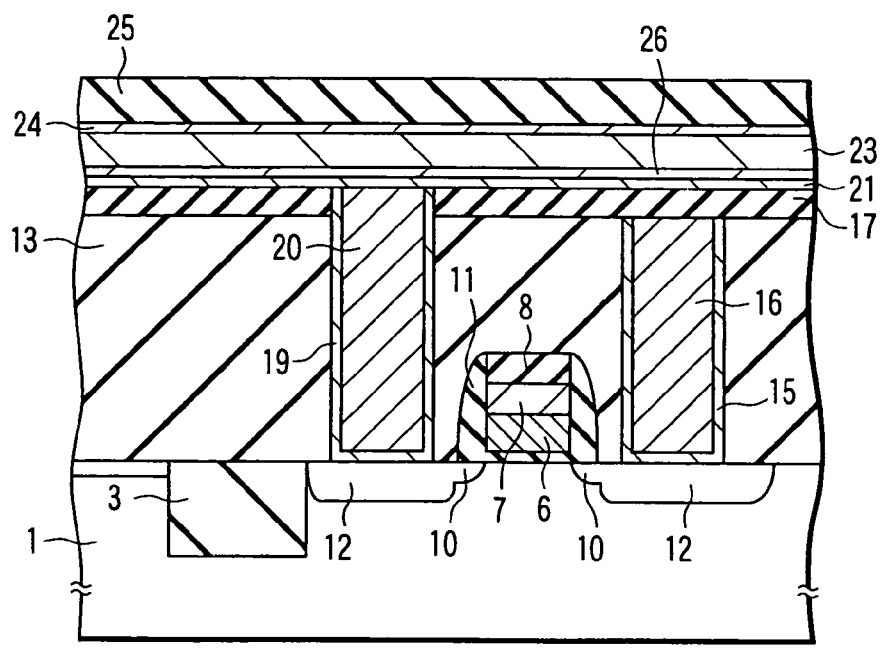

Thereafter, the PZT film 25 is crystallized by a rapid heating treatment at about 600° C. in an oxygen atmosphere (RTA: rapid thermal anneal). At this time, the SiC film 21 reacts with the titanium film 22. As shown in FIG. 1G, a layer containing titanium carbide and titanium silicide (hereinafter referred to as the TiC/TiSi layer) 26 is formed on the surface of the SiC film 21. When a zirconium film, hafnium film, vanadium film, niobium film, or tantalum film is formed instead of the titanium film 22, a layer containing a carbide of zirconium, hafnium, vanadium, niobium, or tantalum, or a layer containing a compound of the metal and carbon in addition to carbide described above is formed.

Here, the thickness of a laminate film (barrier layer) of the SiC film 21 and TiC/TiSi layer 26 approximately corresponds to a total film thickness of the SiC film 21 and Ti film 22, and is about several tens of nanometers or less. That is, the barrier layer of the present embodiment is much thinner than a conventional barrier layer (100 nm or more). Accordingly, a step which includes the capacitor as a convex portion can sufficiently be reduced. An effect is obtained that a focal depth required in a photolithography step is alleviated at the time of the forming of a photoresist pattern on a region including the convex portion. Moreover, the pattern can easily be processed during the forming of the capacitor by the RIE process.

It is to be noted that after forming the titanium film 22, the film may be annealed at 500° C. or more in inert gas or vacuum before the RTA to form the TiC/TiSi layer 26.

Moreover, FIG. 1G shows that the titanium film 22 is all consumed by the reaction and disappears. However, the titanium film 22 may be formed to be thick so that the titanium film 22 remains. In this case, the TiC/TiSi layer 26 is formed so as to be held between the SiC film 21 and titanium film 22. When the titanium film 22 is left, the titanium film 22 serves as an adhesive layer, and an effect is obtained that adhesion between the SiC film 21 and PZT film 25 can be improved.

In the RTA in the oxygen atmosphere, oxygen of one part in the atmosphere is diffused in the PZT film 25 and also reaches the capacitor lower electrode (iridium film 23, first platinum film 24), but the iridium film 23 itself has a certain degree of oxygen diffusion preventive effect. Additionally, the oxygen diffusion preventive effect (barrier property) of the laminate film of the SiC film 21 and TiC/TiSi layer 26 is high, and the W plug 20 provided under the capacitor lower electrode is prevented from being oxidized.

On the other hand, the W plug 16 is covered with not only the laminate film of the SiC film 21 and TiC/TiSi layer 26 but also the silicon nitride film 17, and is therefore naturally prevented from being oxidized.

Furthermore, the laminate film of the SiC film 21 and TiC/TiSi layer 26 does not react with the capacitor lower electrode (iridium film 23, first platinum film 24) provided on the laminate film, or the underlying W plug 20.

Therefore, the laminate film of the SiC film 21 and TiC/TiSi layer 26 does not brought about any trouble in the RTA in the oxidizing atmosphere, accompanying the capacitor manufacturing process of FIG. 1G. That is, in order to obtain the PZT film 25 which has no oxygen deficit and which is sufficiently crystallized and which is superior in characteristics, even when the RTA at the high temperature is carried out under the oxygen atmosphere, thermal stability between the PZT film 25 and W plug 20 is kept.

Here, since SiC is a semiconductor, its resistance value also largely differs with the structure, forming method, presence/absence of doping, and the like. The value of resistivity of β-SiC which is a typical crystal structure is assumed to be $10^{-7} \times 10^{-6}$ Ωcm, and is high as compared with that of a general metal, but the structure has a sufficient conductivity. Therefore, with the use of the thin SiC film 21 as in the present embodiment, there is no problem in electrically connecting the capacitor to the plug.

For example, when the film thickness of the SiC film 21 is 50 nm, and the contact hole 18 is a 0.1 μm square, the resistance value of the SiC film 21 is merely 5.35 Ω. When this resistance value is added to a contact resistance (10 kΩ or more in general) between the capacitor and plug in the absence of the SiC film 21, a substantially actual contact resistance is obtained, but a value of 5.35 Ω is sufficiently smaller than 10 kΩ. Therefore, even with the use of the SiC film 21, a rise of the contact resistance does not raise any problem.

A result of study on the laminate film of the SiC film and the film containing a metal carbide will hereinafter be described, which is a motivation of the present invention.

Reactivity of SiC with a metal material (M) by the heat treatment is generally low, but mainly the following reaction (1) or (2) sometimes occurs depending on the metal material.

$$SiC+M \rightarrow MSi+C \qquad (1)$$

$$SiC+M \rightarrow MC+Si \qquad (2)$$

Alternatively, both the reactions occur. The reaction proceeds in such a manner that Gibbs free energy accompanying the reaction is minimized, but this is a physical property inherent in the material, and therefore there is no general guideline.

However, the present inventors have confirmed that the above-described reaction does not occur at usual capacitor process temperature (temperature necessary for crystallizing the capacitor dielectric film) with respect to predetermined materials, concretely, metals such as tungsten, platinum, ruthenium, iridium, and $SrRuO_3$. It has also been confirmed that the reaction between SiC and Si does not occur at the usual capacitor process temperature.

On the other hand, it has been confirmed that at least the reaction (2) occurs with respect to the metal film formed of metals such as titanium, zirconium, hafnium, vanadium, niobium, and tantalum and that a metal carbide film is formed with the heat treatment in a contact state between the film of these metals and the SiC film.

The metal carbide film includes a crystal structure in which a carbon atom invades between metal atoms, and therefore an effect of inhibiting the diffusion of various types of elements from the outside increases.

Therefore, for a double layer film of the SiC film and metal carbide film produced by the reaction with the SiC film, the diffusion preventive effect is further enhanced as compared with the SiC film of a single layer. That is, the preventive effect of permeation of oxygen in the heat treatment in the oxygen atmosphere is further enhanced, and additionally the preventive effect of mutual diffusion is similarly enhanced.

Moreover, the metal carbide film itself holds metal conductivity. Therefore, when the double layer film of the SiC film and metal carbide film is used in contact portions such as the plug, the contact resistance can be reduced as compared with the use of the SiC film including the single layer.

Figure 2:
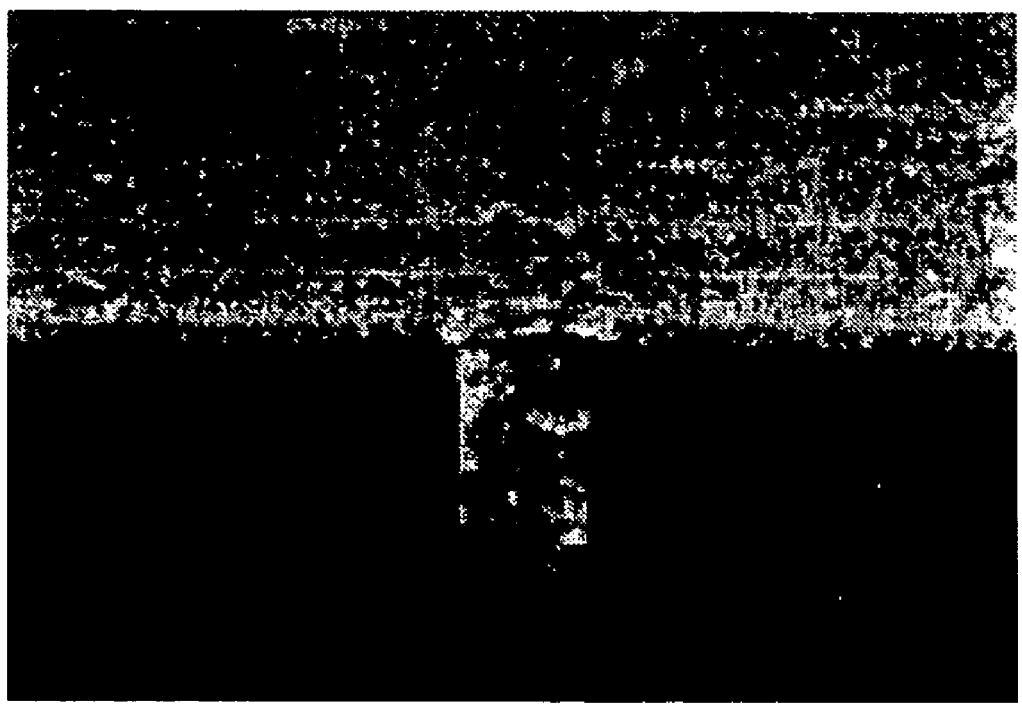
FIG. 2 is a microscope photograph (sectional SEM photograph) of a sample (W/SiC/Ti/Pt structure) subjected to oxygen annealing.

In FIG. 2, after the laminate film of a 7 nm thick SiC film and 2.5 nm thick titanium film is formed on the W plug, a 50 nm thick platinum film is deposited on the laminate film to obtain a sample (W/SiC/Ti/Pt structure). A sectional SEM photograph of the sample subjected to oxygen anneal at 650° C. for one hour is shown in FIG. 2. It is seen from FIG. 2 that oxygen is easily diffused in the platinum film as well known, but nevertheless the W plug is not oxidized at all. This is because the SiC film reacts with the titanium film to form the TiC/TiSi layer on the surface of the SiC layer, and the laminate film of the SiC film and TiC/TiSi layer high in the oxygen diffusion preventive effect is formed.

Figure 1H:
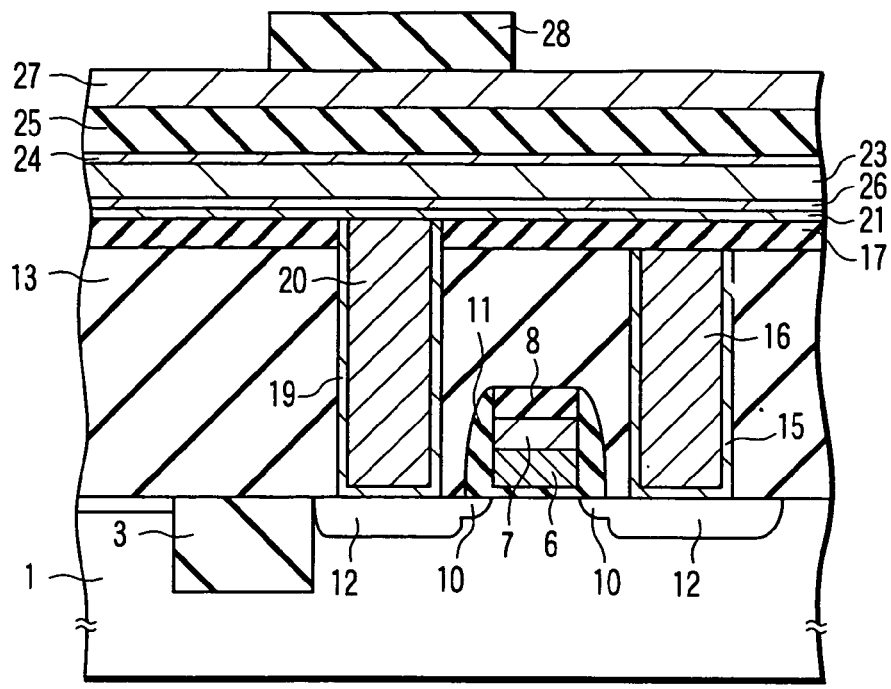

Turning back to the process of the COP type FeRAM cell of the present embodiment, after the step of FIG. 1G, as shown in FIG. 1H, a second platinum film 27 which is processed into a capacitor upper electrode is formed on the PZT film 25 by the sputter process, and subsequently an insulating film mask 28 formed of the silicon oxide film is formed on the second platinum film 27.

The insulating film mask 28 is formed by the following process. First, the silicon oxide film is formed on the second platinum film 27. Next, a resist mask is formed on the silicon oxide film by photolithography, and the like. Moreover, the resist mask is used as a mask to etch the silicon oxide film by the RIE process so that the insulating film mask 28 is obtained. Thereafter, the resist is peeled to obtain a sectional structure shown in FIG. 1H.

Figure 1I:
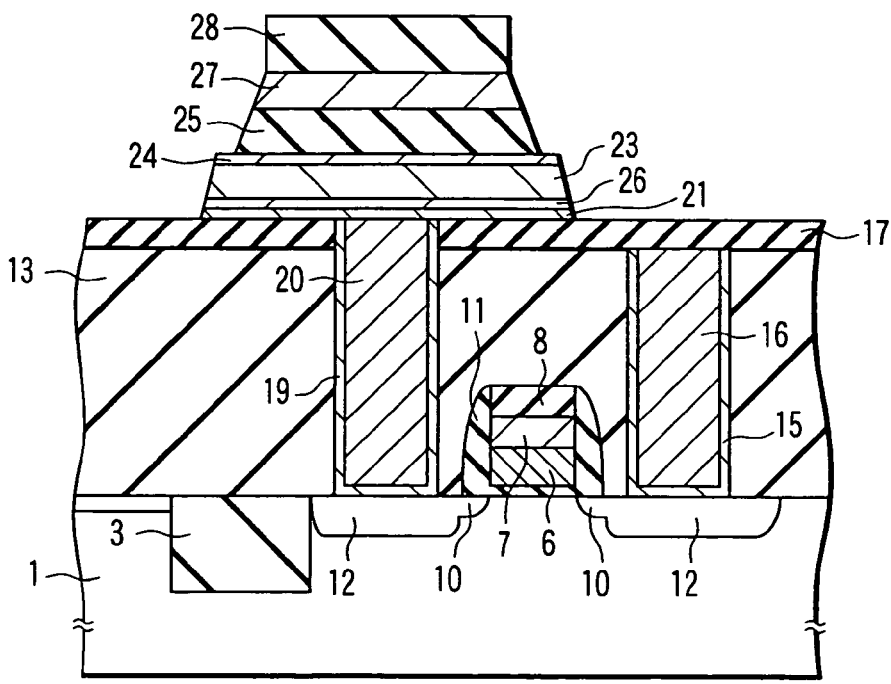

Next, as shown in FIG. 1I, the insulating film mask 28 is used as the mask to etch the second platinum film 27 and PZT film 25 by the RIE process so that the capacitor upper electrode including the second platinum film 27 and the capacitor dielectric film including the PZT film 25 are formed. Thereafter, the insulating film mask 28 is removed.

Figure 1J:
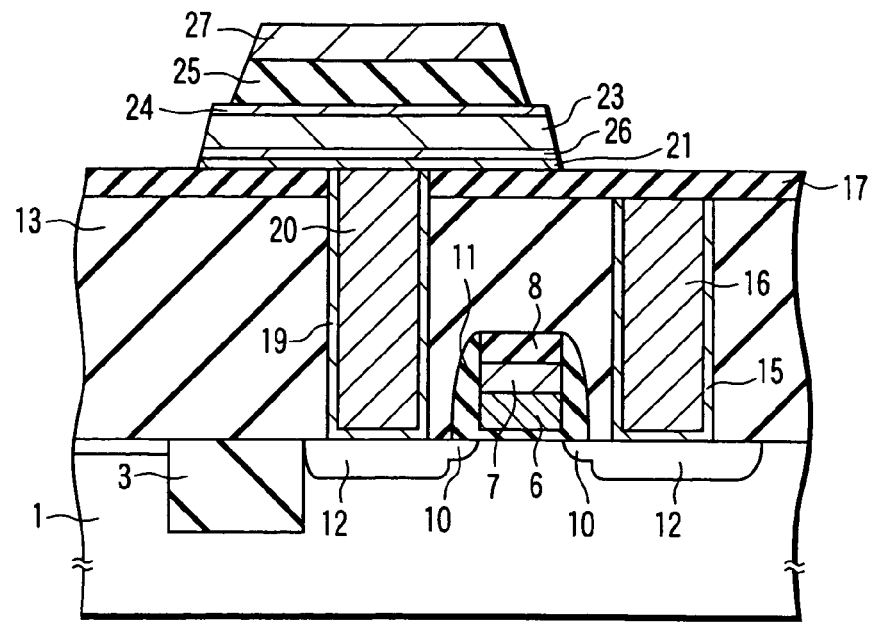

Next, as shown in FIG. 1J, the resist mask (not shown) with which the second platinum film 27 and PZT film 25 are covered is formed on the first platinum film 24. Subsequently, the resist mask is used as the mask to etch the first platinum film 24 and iridium film 23 by the RIE process so that the capacitor lower electrode including the iridium film 23 and first platinum film 24 is obtained. Moreover, the etching by the RIE process is further advanced to process the TiC/TiSi layer 26 and SiC film 21 so that the capacitor can be obtained.

Figure 1K:
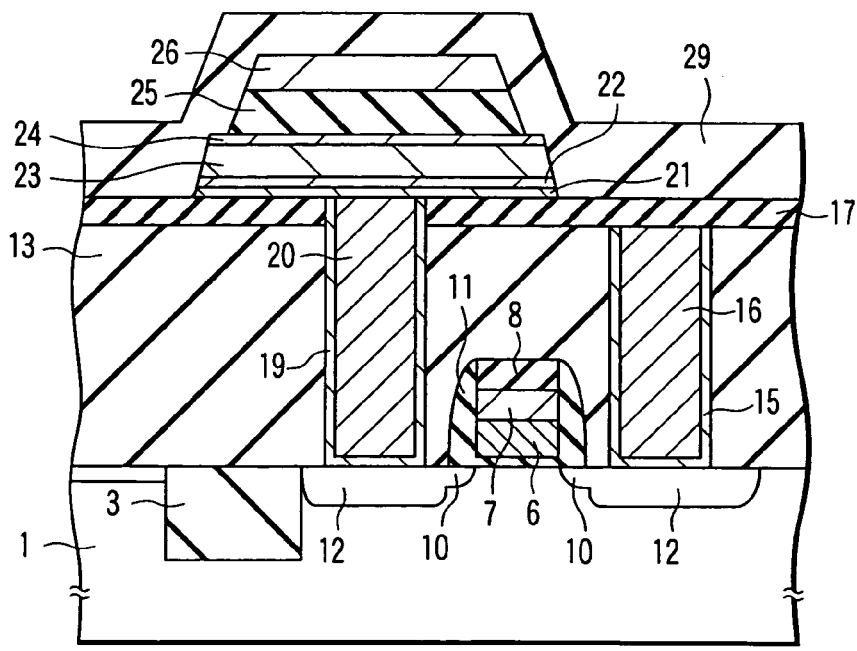

Next, as shown in FIG. 1K, a silicon oxide film 29 is formed on the whole surface by the CVD process. Subsequently, in order to remove damage caused in the PZT film 25 at the time of the etching by the RIE process and the forming of the SiO$_2$ insulating film in the step of FIG. 1I, the heat treatment at about 600° C. is carried out under the oxygen atmosphere.

Here, in the heat treatment under the oxidizing atmosphere, oxygen also penetrates in the capacitor and contributes to damage recovery. On the other hand, a part of oxygen also reaches the capacitor lower electrode (iridium film 23, first platinum film 24). However, the iridium film 23 itself has a certain degree of oxygen diffusion preventive effect. Additionally, since the oxygen diffusion preventive effect of the laminate film of the SiC film 21 and TiC/TiSi layer 26 is high, the W plug 20 under the capacitor lower electrode is not oxidized.

SiC is a material which is thermally remarkably stable at a melting point of 2000° C. or more and which is remarkably low in oxygen permeability. Therefore, when the SiC film 21 is provided on the W plug 16 (metal plug) as in the present embodiment, the SiC film 21 itself is not changed, and the W plug 16 can remarkably efficiently be prevented from being oxidized even in a plurality of steps of the heat treatment under the oxidizing atmosphere including the heat treatment under the oxidizing atmosphere for a purpose of removing the damage after forming the W plug 16.

Moreover, the laminate film of the SiC film 21 and TiC/TiSi layer 26 does not react with materials contained in the films 23, 24, 20 provided upper and under the laminate film. Therefore, the laminate film of the SiC film 21 and TiC/TiSi layer 26 does not bring about any trouble in the heat treatment in oxygen accompanying the capacitor manufacturing process of FIG. 1K, and thermal stability between the PZT film 25 and W plug 20 is held.

On the other hand, the W plug 16 is not coated with not only the laminate film of the SiC film 21 and TiC/TiSi layer 26 but also the silicon nitride film 17, and is therefore naturally prevented from being oxidized.

Thereafter, although not shown, through known steps, that is, a step of forming a contact communicating with the other source/drain diffusion layer 12 of the MOS transistor, a step of forming a driving line, a step of forming a bit line, and a step of laying an upper layer metal wiring, an FeRAM cell is completed.

In the known steps such as the step of forming the contact, a region to be etched including the step which includes the capacitor as the convex portion, excluding an etching region, needs to be coated with the resist (etching mask). At this time, as described above, according to the present embodiment, since the step which includes the capacitor as the convex portion is sufficiently small, the photolithography step is easily carried out with high precision. As a result, it is possible to easily and precisely form the resist.

As described above, according to the present embodiment, by the use of the laminate film of the SiC film 21 and TiC/TiSi layer 26 high in the oxygen diffusion preventive effect as the barrier layer, the barrier layer can be formed into a thin film. Moreover, the oxidation of the W plug 20 by the heat treatment at the high temperature under the oxygen atmosphere for a purpose of crystallization of the PZT film 25 or the recovery of the damage can effectively be prevented. Accordingly, it is possible to realize the FeRAM including the COP type FeRAM cell high in characteristics/reliability.

It is to be noted that in the present embodiment the titanium film 22 is formed on the SiC film 21, but it is possible to use, for example, the zirconium film, hafnium film, vanadium film, niobium film, or tantalum film instead of the titanium film 22.

Moreover, in the present embodiment, PZT is used as the material of the capacitor dielectric film, and platinum or iridium is used as the material of the capacitor upper and lower electrode, but the present invention is not limited to the material.

For example, it is also possible to use ferroelectric materials such as SBT (SrBi$_2$Ta$_2$O$_9$) and BIT (Bi$_4$Ti$_3$O$_{12}$) as the materials of the capacitor dielectric film.

Here, since the crystallization temperature of SBT is about 750° C., and is higher than that (about 600° C.) of PZT, the heat treatment at a higher temperature under the oxidizing atmosphere is necessary for using SBT. Therefore, problem of oxidation of the plug (the W plug 20 herein) right under the capacitor is more serious. However, according to the present embodiment, even when the ferroelectric material requiring the heat treatment at temperature higher than that of PZT, a similar effect can be anticipated.

On the other hand, as the material of the capacitor upper/lower electrode, compound derivatives such as ruthenium and strontium ruthenium oxide (SrRuO$_3$) can also be used.

Moreover, in the present embodiment, the laminate film of the SiC film 21 and TiC/TiSi layer 26 is used as the barrier layer, but the metal carbide film which does not contain titanium silicide and whose major component is titanium carbide (TiC) may also be used instead of the TiC/TiSi layer 26. That is, the laminate film of the SiC film and metal carbide film may also be used.

(Second Embodiment)

FIGS. 3A to 3G are sectional views showing the manufacturing process of the COP type FeRAM cell according to a second embodiment of the present invention. It is to be noted that portions corresponding to those of FIGS. 1A to 1K are denoted with the same reference numerals of FIGS. 1A to 1K, and detailed description is omitted.

The present embodiment is different from the first embodiment mainly in that a polycrystalline silicon plug is provided under the capacitor and an $SrRuO_3$ film is used in the capacitor lower and upper electrodes.

Figure 3A:
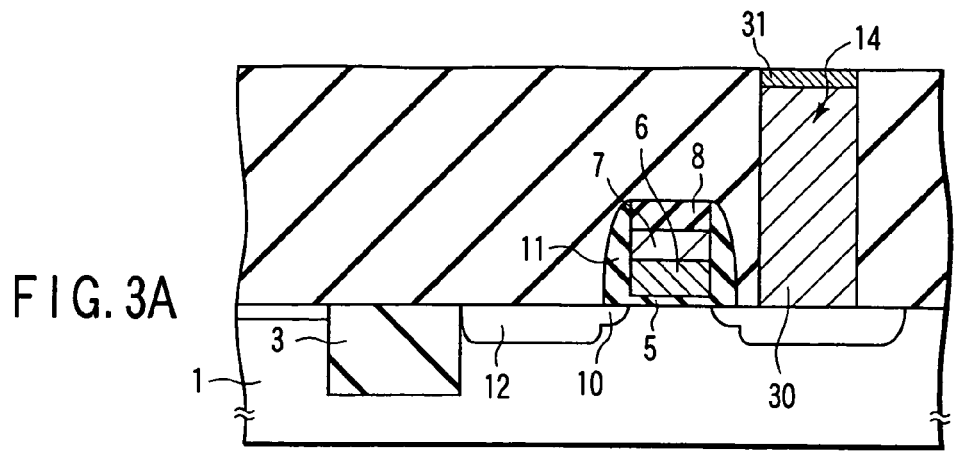
FIGS. 3A to 3G are sectional views showing the manufacturing process of the COP type FeRAM cell according to a second embodiment of the present invention.

First, in the same manner as in the first embodiment, the steps of FIGS. 1A to 1C are carried out. Subsequently, as shown in FIG. 3A, a polycrystalline silicon plug 30 formed of a polycrystalline silicon film in which the inside of the contact hole 14 is doped with arsenic is formed, further a titanium silicide film 31 is formed on the polycrystalline silicon plug 30, and the inside of the contact hole 14 is filled with the polycrystalline silicon plug 30 and titanium silicide film 31.

A concrete method of forming the polycrystalline silicon plug 30 and titanium silicide film 31 is as follows.

First, the polycrystalline silicon film is formed on the whole surface by the CVD process so as to fill in the contact hole 14. Moreover, an unnecessary polycrystalline silicon film outside the contact hole 14 is removed, and the polycrystalline silicon plug 30 formed of the polycrystalline silicon film is buried in the contact hole 14. Next, the titanium film (not shown) is formed on the whole surface by the CVD process. Thereafter, by the heat treatment, the titanium film reacts with the upper part of the polycrystalline silicon plug 30, and the upper part of the polycrystalline silicon plug 30 is replaced with the titanium silicide film 31. Moreover, an unreacted titanium film is removed to obtain a sectional structure shown in FIG. 3A.

Figure 3B:
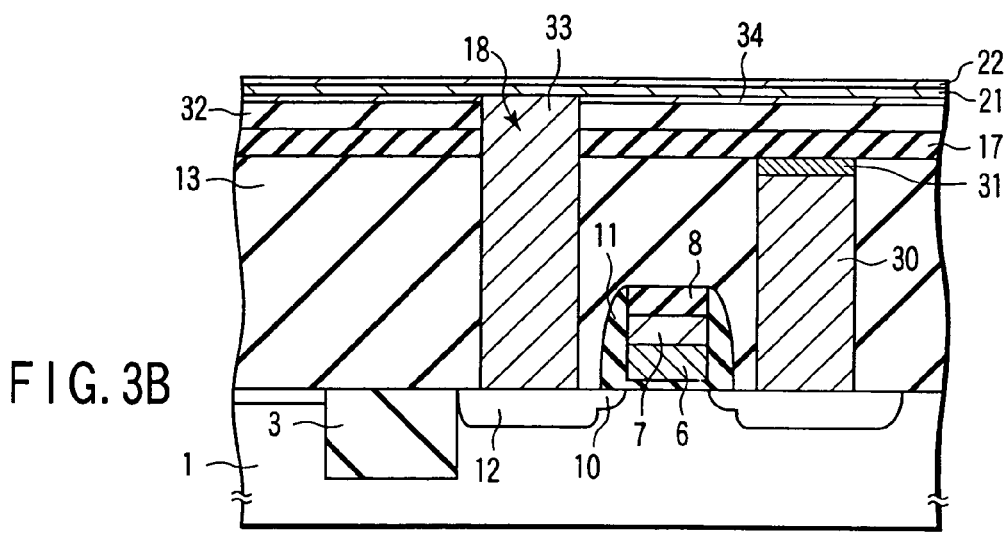

Next, as shown in FIG. 3B, by the CVD process, the silicon nitride film 17 and a silicon oxide film 32 are successively formed on the whole surface. Subsequently, the contact hole 18 reaching the source/drain diffusion layer 12 to be connected to the capacitor is opened in the silicon oxide film 32, silicon nitride film 17, and silicon oxide film 13. Thereafter, by a process similar to that of the polycrystalline silicon plug 30, the inside of the contact hole 18 is filled with a polycrystalline silicon plug 33.

Next, as shown in FIG. 3B, by the sputter process, a titanium film 34 having a thickness of about 2.5 nm, the SiC film 21 having a thickness of 10 nm, and the titanium film 22 having a thickness of about 2.5 nm are successively formed on the whole surface.

Figure 3C:
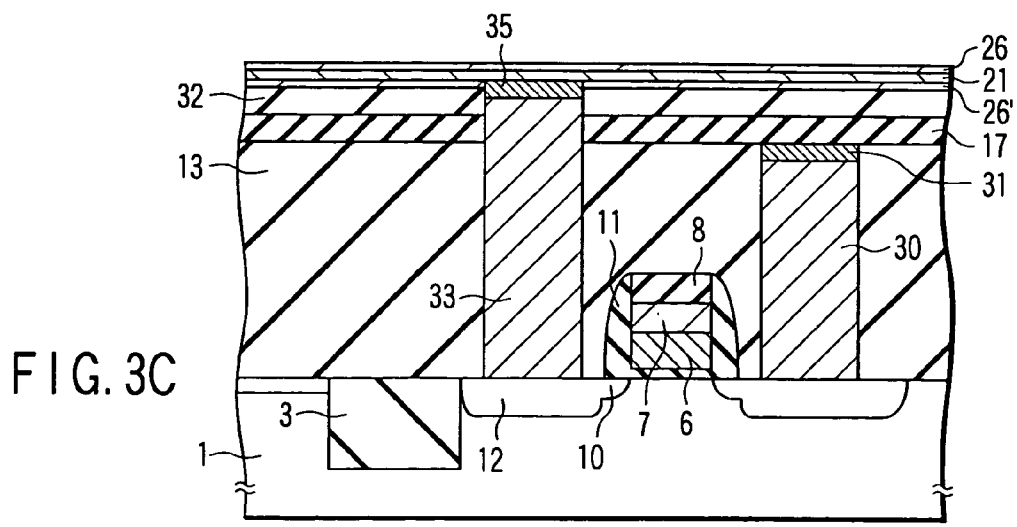

Next, anneal at 500° C. or more in an inert gas or vacuum is carried out to react the SiC film 21 with the titanium film 22 so that the TiC/TiSi layer 26 is formed as shown in FIG. 3C.

At this time, a portion of the titanium film 34 which contacts the polycrystalline silicon plug 33 changes to a titanium silicide film 35, and a remaining portion changes to a TiC/TiSi layer 26'. A total film thickness of the laminate film (barrier layer) of the TiC/TiSi layer 26', SiC film 21, and TiC/TiSi layer 26 is about 15 nm, and is sufficiently small as compared with the film thickness (100 nm) of a conventional barrier layer. It is to be noted that the titanium film 34 may also be formed to be thick and a part of the titanium film 34 remains. In this case, the remaining titanium film 34 fulfills a function of enhancing adhesion between the polycrystalline silicon plug 33 and the PZT film 25 formed later.

Figure 3D:
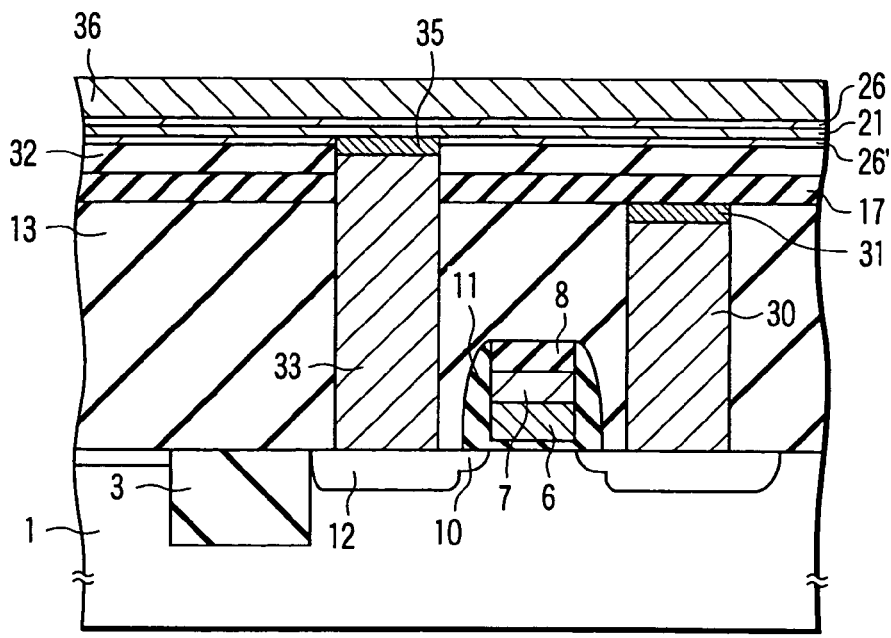

Next, as shown in FIG. 3D, a first $SrRuO_3$ film 36 (film structure is amorphous) which is processed into the capacitor lower electrode is formed on the TiC/TiSi layer 26 by the sputter process. Subsequently, RTA is carried out at 600° C., and the $SrRuO_3$ film 36 is crystallized to obtain the high-quality crystalline $SrRuO_3$ film 36 which can be used as the electrode.

It is to be noted that the anneal of the step of FIG. 3C may also be omitted in forming the TiC/TiSi layers 26, 26' by RTA of the present step. However, when a thermal step for forming the TiC/TiSi layers 26, 261 is carried out separately from a thermal step for crystallizing the $SrRuO_3$ film 36 as in the present invention, an effect that each thermal step can be optimized is obtained.

Figure 3E:
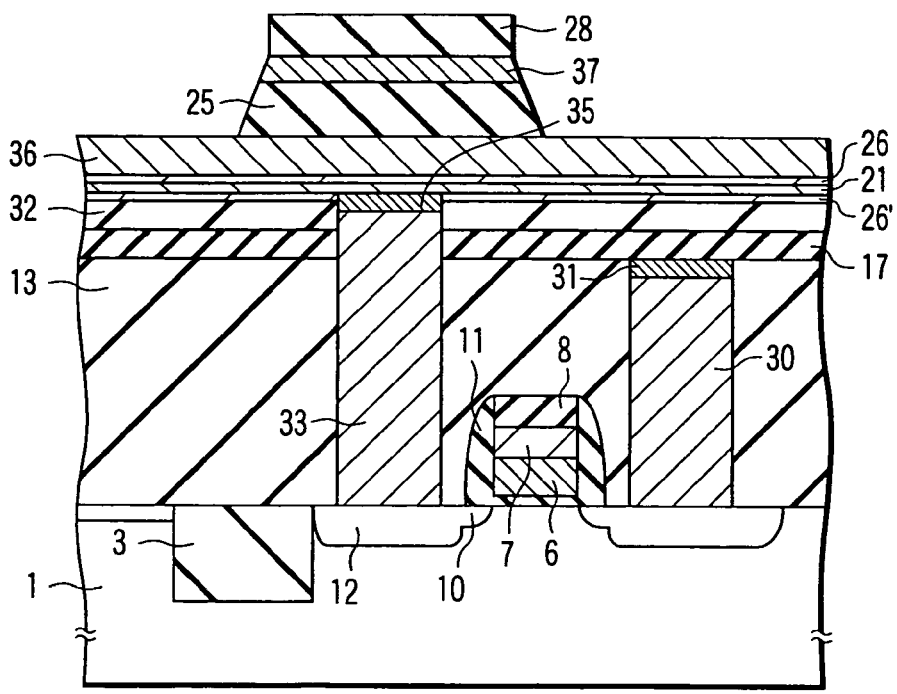

Next, as shown in FIG. 3E, the PZT film 25 forming the capacitor dielectric film is formed on the $SrRuO_3$ film 36 by the sputter process, and subsequently the PZT film 25 is crystallized by RTA in the oxygen atmosphere.

In RTA in the oxygen atmosphere, oxygen of a part of the atmosphere is diffused in the PZT film 25 and also reaches the capacitor lower electrode (first $SrRuO_3$ film 36). However, since the oxygen diffusion preventive effect of the film of the TiC/TiSi layer 26', SiC film 21, and TiC/TiSi layer 26 is high, the polycrystalline silicon plug 33 and titanium silicide film 35 provided under the capacitor lower electrode are not oxidized.

Moreover, the laminate film of the TiC/TiSi layer 26', SiC film 21, and TiC/TiSi layer 26 does not react with the material contained in the films 36, 35, 33 provided upper and under the laminate film. Therefore, the laminate film of the TiC/TiSi layer 26', SiC film 21, and TiC/TiSi layer 26 does not cause any trouble in RTA in the oxygen atmosphere in the process for manufacturing the capacitor of FIG. 3E. That is, in order to obtain the PZT film 25 which has no oxygen deficit and which is sufficiently crystallized and which is superior in characteristics, even when the RTA at the high temperature is carried out under the oxygen atmosphere, the thermal stability between the PZT film 25 and polycrystalline silicon plug 33 is kept.

Furthermore, since SiC is the material thermally remarkably stable and remarkably low in oxygen permeability as described above, the SiC film 21 itself is not changed, and the polycrystalline silicon plug 33 can remarkably efficiently be prevented from being oxidized even in a plurality of steps of the heat treatment under the oxidizing atmosphere including RTA under the oxide after forming the polycrystalline silicon plug 33.

On the other hand, the polycrystalline silicon plug 30 or the titanium silicide film 31 is coated with not only the laminate film of the TiC/TiSi layer 26', SiC film 21, and TiC/TiSi layer 26 but also the silicon nitride film 17 and silicon oxide film 32, and is therefore naturally prevented from being oxidized.

Thereafter, as shown in FIG. 3E, a second $SrRuO_3$ film 37 is formed as the capacitor upper electrode on the PZT film 25 by the sputter process and RTA, and the insulating film mask 28 comprises the silicon oxide film is formed on the second $SrRuO_3$ film 37.

Next, the insulating film mask 28 is used as the mask to etch the second $SrRuO_3$ film 37 and PZT film 25 by the RIE process so that the capacitor upper electrode including the second $SrRuO_3$ film 37 and the capacitor dielectric film including the PZT film 25 are formed. Thereafter, the insulating film mask 28 is removed.

Figure 3F:
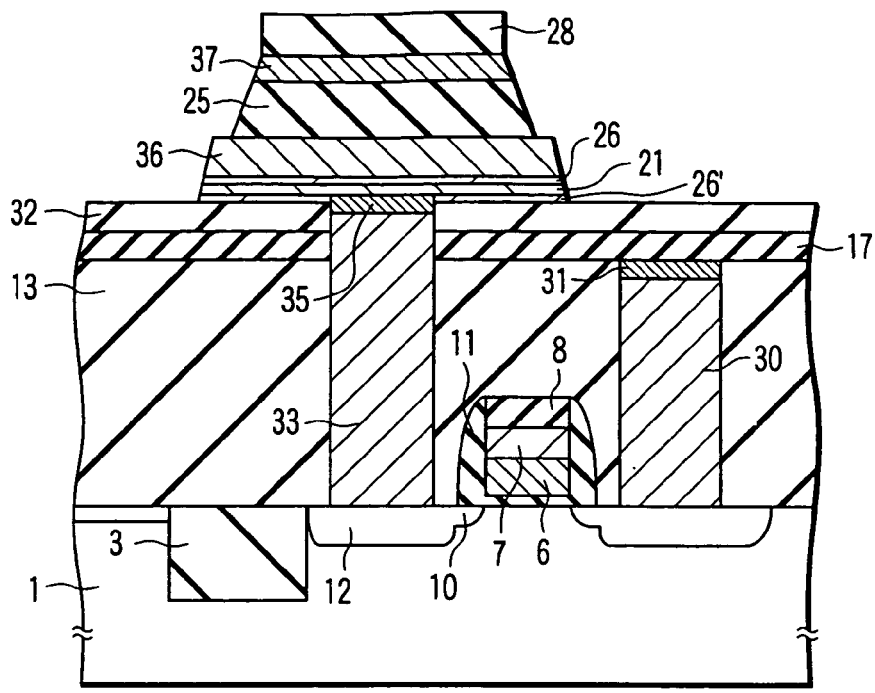

Next, as shown in FIG. 3F, the resist mask (not shown) with which the second $SrRuO_3$ film 37 and PZT film 25 are coated is formed on the first $SrRuO_3$ film 36, and the resist mask is used as the mask to etch the first $SrRuO_3$ film 36, TiC/TiSi layer 26, SiC film 21, and TiC/TiSi layer 26' by the RIE process so that the capacitor is obtained.

Figure 3G:
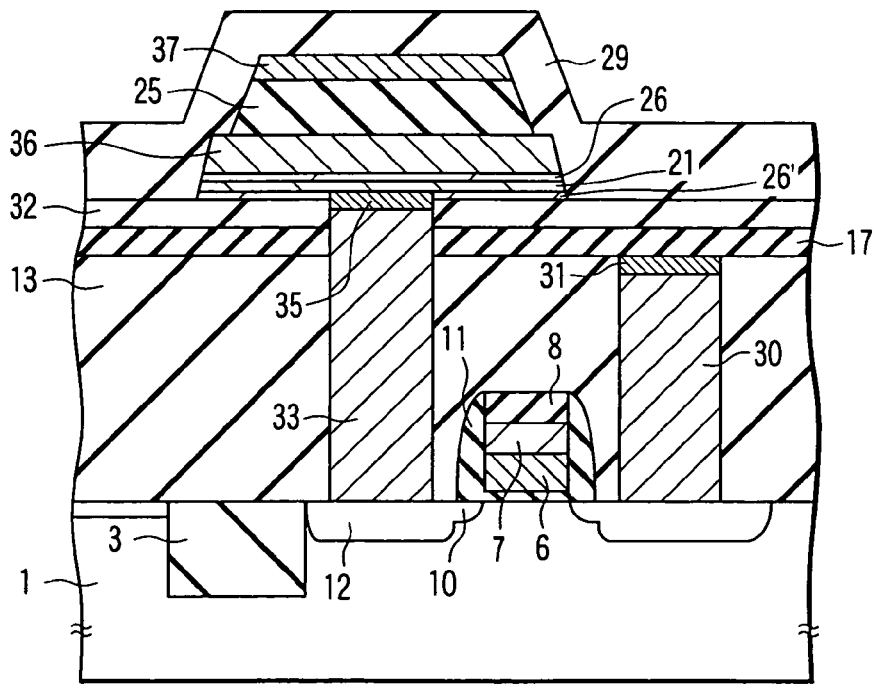

Next, as shown in FIG. 3G, the silicon oxide film 29 is formed on the whole surface by the CVD process. Subsequently, in order to remove the damage caused in the PZT film 25 by the RIE process in the step of FIG. 3F, the heat treatment at about 600° C. is carried out under the oxygen atmosphere.

Here, in the heat treatment under the oxidizing atmosphere, oxygen penetrates in the capacitor and contributes to the recovery of the damage. On the other hand, a part of oxygen also reaches the capacitor lower electrode (first $SrRuO_3$ film 36). However, since the oxygen diffusion preventive effect of the laminate film of the TiC/TiSi layer 26', SiC film 21, and TiC/TiSi layer 26 is high, the polycrystalline silicon plug 33 and titanium silicide film 35 under the capacitor lower electrode are not oxidized.

Moreover, the laminate film of the TiC/TiSi layer 26', SiC film 21, and TiC/TiSi layer 26 does not react with the materials contained in the films 36, 35, 33 provided upper and under the laminate film. Therefore, the laminate film of the TiC/TiSi layer 26', SiC film 21, and TiC/TiSi layer 26 does not cause any trouble in the heat treatment in the oxygen atmosphere of FIG. 3G. That is, even when the heat treatment at the high temperature is carried out under the oxygen atmosphere in order to sufficiently recover the damage of the PZT film 25, the thermal stability between the PZT film 25 and polycrystalline silicon plug 33 is kept.

Thereafter, although not shown, through the known steps, that is, the step of forming the contact reaching the other source/drain diffusion layer 12 of the MOS transistor, the step of forming the driving line, the step of forming the bit line, and the step of laying the upper layer metal wiring, the FeRAM cell is completed.

Since the step which includes the capacitor as the convex portion is sufficiently small, in the same manner as in the first embodiment, the resist (etching mask) required in the above-described known steps can easily and correctly be formed.

As described above, according to the present embodiment, by the use of the laminate film of the TiC/TiSi layer 26', SiC film 21, and TiC/TiSi layer 26 high in the oxygen diffusion preventive effect as the barrier layer, the barrier layer can be formed into the thin film. Moreover, the oxidation of the polycrystalline silicon plug 33 by the heat treatment at the high temperature under the oxygen atmosphere for the purpose of the crystallization of the PZT film 25 or the recovery of the damage can effectively be prevented. Accordingly, it is possible to realize the FeRAM including the COP type FeRAM cell high in the characteristics and reliability.

The present inventors used a sample similar to a capacitor/plug structure of the present embodiment to carry out experiments, and confirmed the effect of the present embodiment. Concretely, first a titanium silicide film (30 nm), SiC film (7 nm), titanium film (2.5 nm), iridium film (50 nm), platinum film (10 nm), $SrRuO_3$ film (10 nm), and PZT film (130 nm) are successively deposited on the polycrystalline silicon plug to prepare a sample (Si/TiSi/SiC/Ti/Ir/Pt/SrRuO$_3$/PZT structure). Next, the sample was subjected to oxygen anneal at 650° C. for one hour, and thereafter concentration profile of a depth direction of each element was measured by SIMS.

Figure 4:
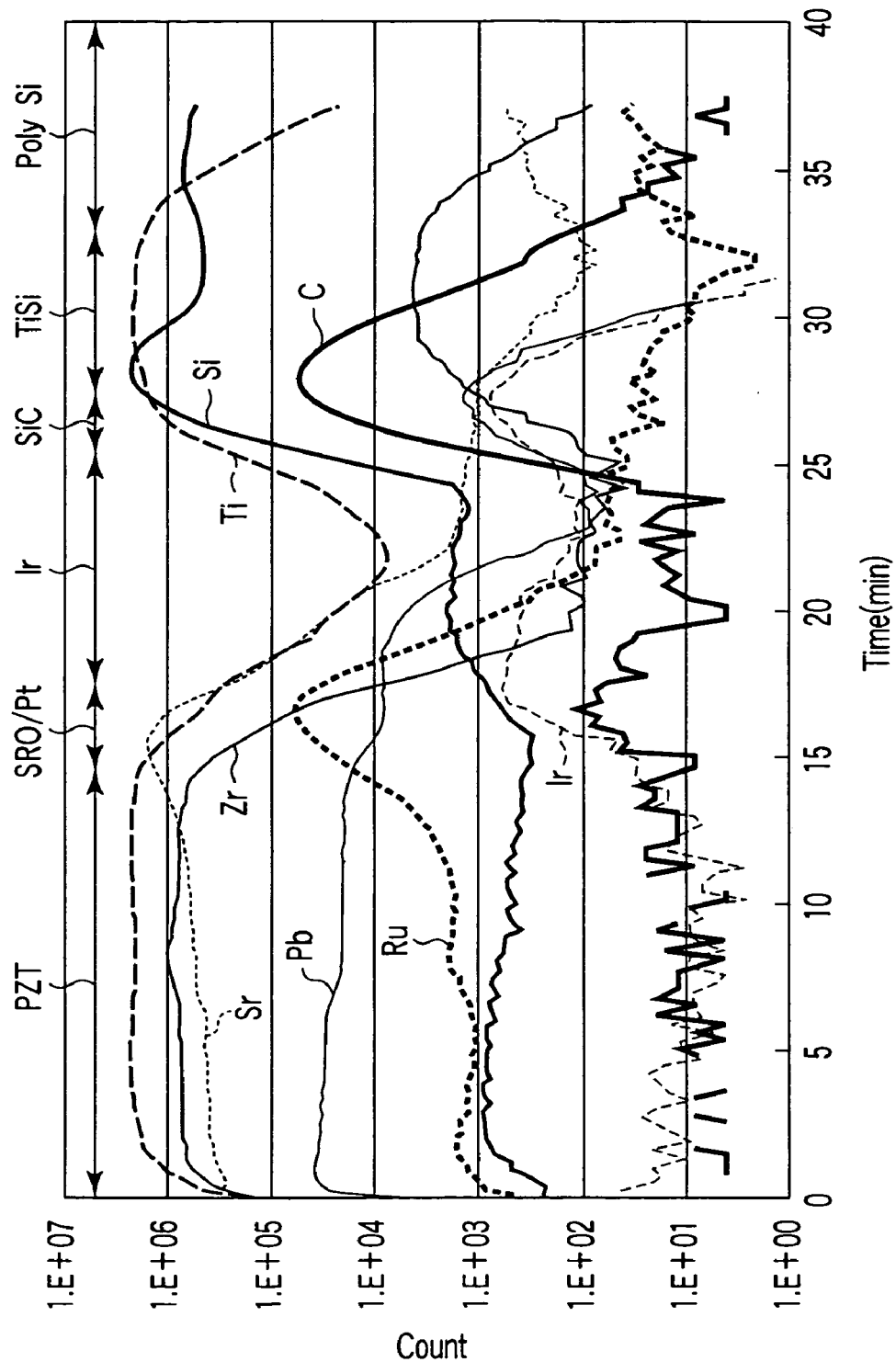
FIG. 4 is a diagram showing a result of SIMS analysis of the sample (Si/TiSi/SiC/Ti/Ir/Pt/SrRuO$_3$/PZT structure) subjected to the oxygen annealing.

Analysis results (voltage-residual polarization (V-Pr) characteristics) are shown in FIG. 4. It is seen from FIG. 4 that the reaction and mutual diffusion between the plug material (Si) and electrode materials (Ir, Ru, Pt) are not recognized with respect to the polycrystalline silicon plug under the SiC film, the Ir film on the SiC film, the $SrRuO_3$ film, and the Pt film (electrode).

Figure 5A:
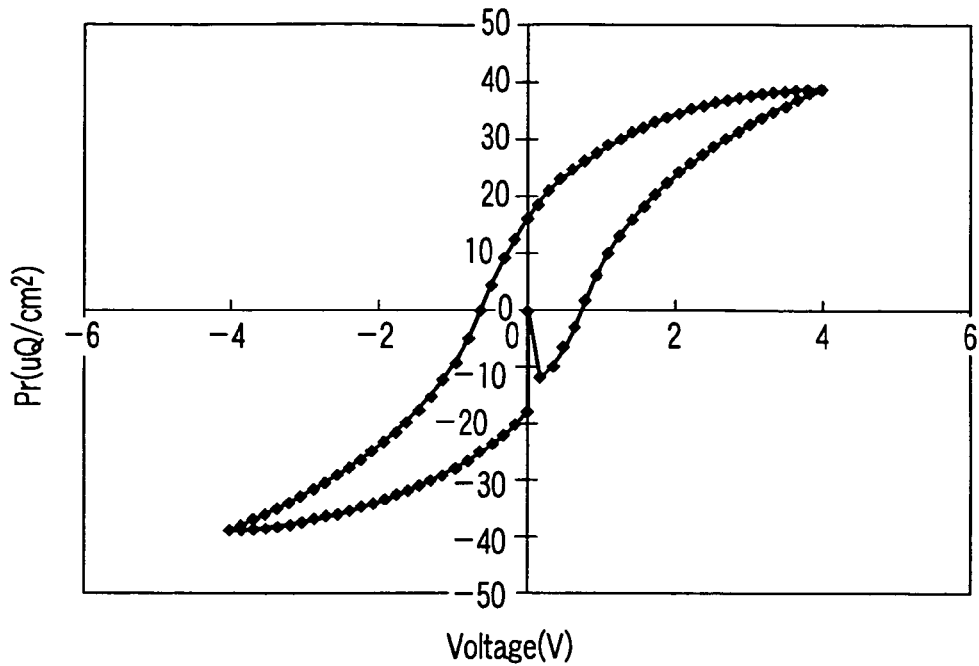
FIGS. 5A and 5B are diagrams showing hysteresis characteristics of a capacitor formed using the sample of FIG. 4 and a capacitor using a structure in which a Ti film is omitted from the sample.
Figure 5B:
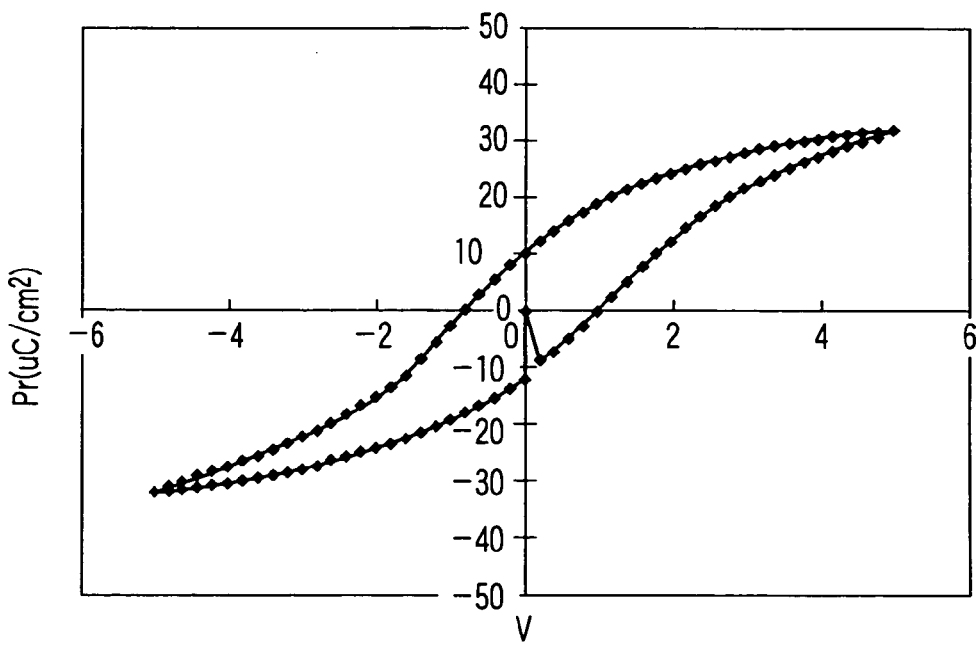

Moreover, FIGS. 5A and 5B show hysteresis characteristics of a capacitor obtained by subjecting the sample to the oxygen anneal and successively forming the $SrRuO_3$ film and platinum film as the capacitor upper electrode on the oxygen-annealed sample, and a capacitor similarly formed using the sample from which the Ti film is omitted.

It is seen from FIGS. 5A and 5B that by the use of the sample including the laminate film of the SiC film and Ti film, satisfactory hysteresis characteristics are obtained as compared with the sample of the SiC film alone, from which the Ti film has been omitted.

It is to be noted that also in the present invention, in the same manner as in the first embodiment, it is possible to use, for example, the zirconium film, hafnium film, vanadium film, niobium film, or tantalum film instead of the titanium film 22. Moreover, also with respect to the capacitor material, in the same manner as in the first embodiment, the ferroelectric materials such as SBT and BIT can be used instead of the capacitor material.

Moreover, in the present embodiment, $SrRuO_3$ is used in the material of the capacitor upper/lower electrode, but the present invention is not limited to this material. For example, it is possible to use conductive composite oxides such as $BaRuO_3$, noble metals such as platinum, iridium, and ruthenium, or oxides of the noble metals.

(Third Embodiment)

FIGS. 6A to 6D are sectional views showing the manufacturing process of the COP type FeRAM cell according to a third embodiment of the present invention. It is to be noted that the portions corresponding to those of FIGS. 1A to 1K are denoted with the same reference numerals of FIGS. 1A to 1K, and the detailed description is omitted.

The present embodiment is different from the first embodiment in that the W plug positioned under the capacitor is coated with the laminate film of the SiC film and TiC/TiSi layer.

Figure 6A:
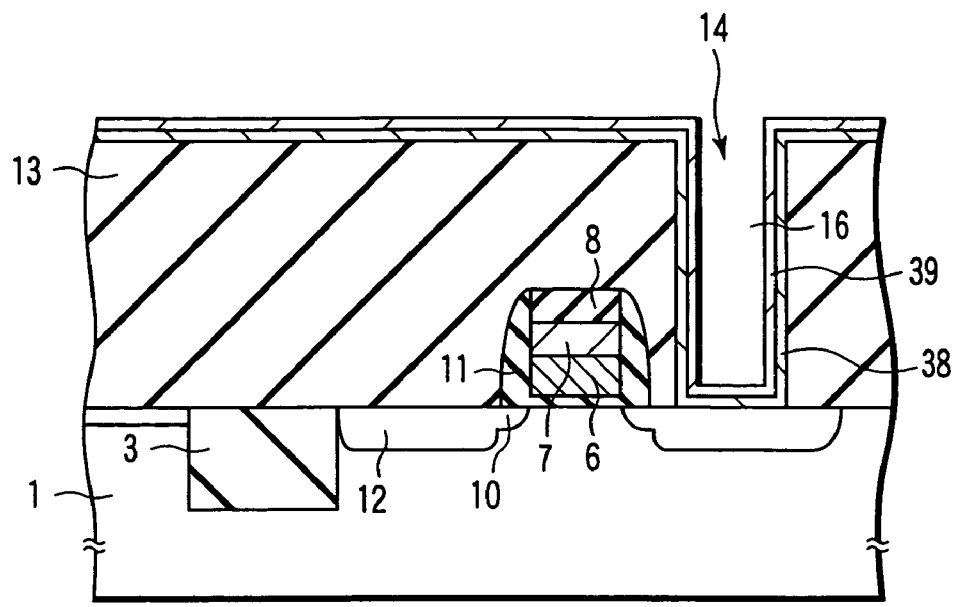
FIGS. 6A to 6D are sectional views showing the manufacturing process of the COP type FeRAM cell according to a third embodiment of the present invention.

First, in the same manner as in the first embodiment, the steps of FIGS. 1A to 1C are carried out. Subsequently, as shown in FIG. 6A, an SiC film 38 having a thickness of 10 nm or less is formed on the whole surface by the CVD process so as to coat the inner wall of the contact hole 14. Thereafter, a thin titanium film 39 having a thickness of about 5 nm is formed on the SiC film 38 by the sputter process. Here, the SiC film 38 is formed by the sputter process, and the titanium film 39 may also be formed by the CVD process.

Figure 6B:
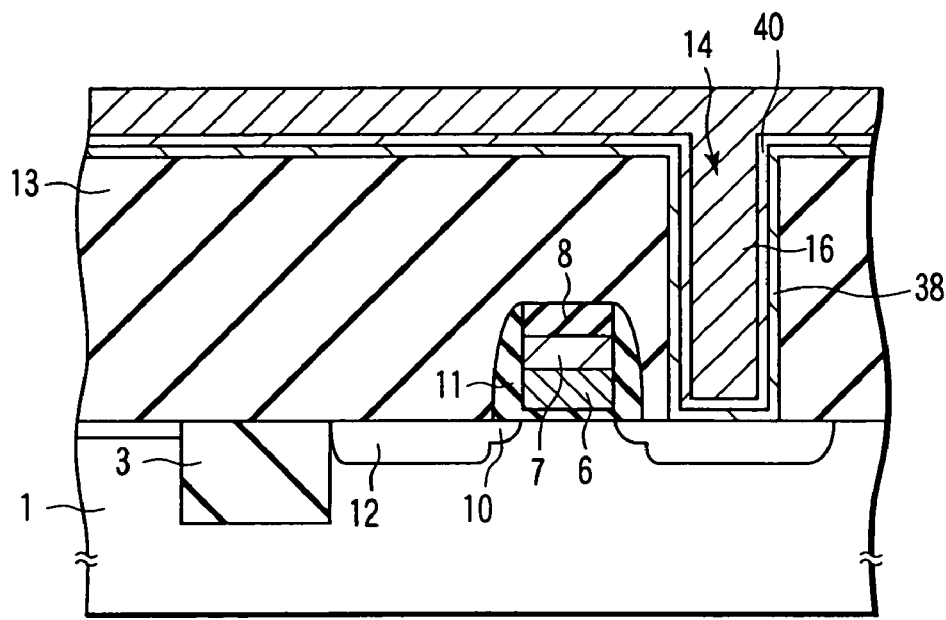

Next, as shown in FIG. 6B, the annealing is carried out in the inert gas or vacuum, the SiC film 38 is reacted with the titanium film 39, and a TiC/TiSi layer 40 is formed on the surface of the SiC film 38. Subsequently, the W film 16 which is processed into the W plug is formed on the whole surface so as to fill in the contact hole 14.

Figure 6C:
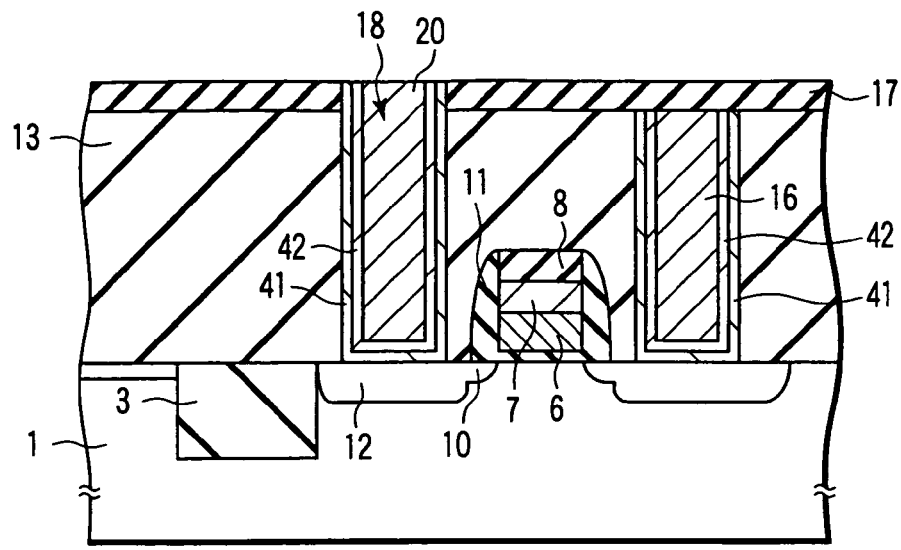

Next, as shown in FIG. 6C, the unnecessary W film 16, SiC film 38, and TiC/TiSi layer 40 outside the contact hole 14 are removed, for example, by the CMP process.

Next, as shown in FIG. 6C, the silicon nitride film 17 is formed on the whole surface. Subsequently, the contact hole 18 reaching the source/drain diffusion layer 12 connected to the capacitor is opened. Thereafter, in the same manner as in the steps of FIGS. 6A, 6B, the W plug 20 is buried and formed in the contact hole 18 via an SiC film 41 and TiC/TiSi layer 42.

Figure 6D:
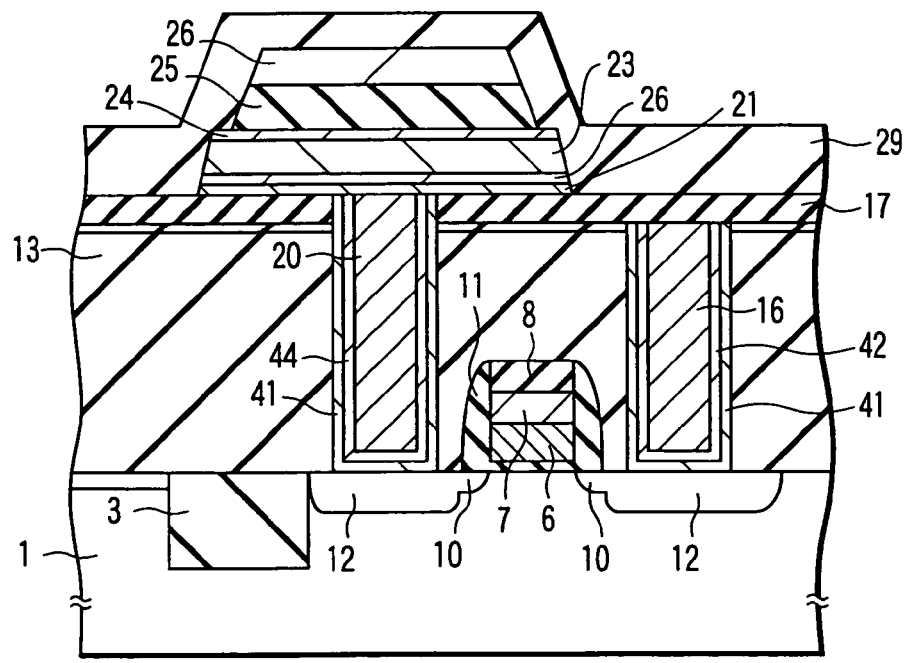

Next, the steps of FIGS. 1G to 1K described in the first embodiment are carried out. Subsequently, in order to remove the damage caused in the PZT film 25 at the time of the etching processing in the step of FIG. 1I, the heat treatment is carried out at about 600° C. under the oxygen atmosphere. A sectional view in this stage is shown in FIG. 6D.

At this time, in the same manner as in the first embodiment, oxygen in a part of the atmosphere also reaches the capacitor lower electrode (iridium film 23, first platinum film 24). However, since the iridium film 23 itself has a certain degree of oxygen diffusion preventive effect, and the oxygen diffusion preventive effect of the laminate film of the SiC film 21 and TiC/TiSi layer 26 is high, the W plug 20 provided under the capacitor lower electrode is not oxidized.

Moreover, in the same manner as in the first embodiment, the SiC film 21 itself is not changed, and the polycrystalline silicon plug 33 can remarkably efficiently be prevented from being oxidized even in a plurality of steps of the heat treatment under the oxidizing atmosphere after forming the W plug 20. Furthermore, in the same manner as in the first embodiment, the laminate film of the SiC film 21 and TiC/TiSi layer 26 does not cause any trouble in the heat treatment in the oxygen atmosphere, accompanying the capacitor manufacturing process, and the thermal stability between the PZT film 25 and W plug 20 is kept.

On the other hand, the W plug 16 is coated with not only the laminate film of the SiC film 21 and TiC/TiSi layer 26 but also the silicon nitride film 17, and is therefore naturally prevented from being oxidized.

Thereafter, although not shown, through the known steps, that is, the step of forming the contact reaching the other source/drain diffusion layer 10 of the MOS transistor, the step of forming the driving line, the step of forming the bit line, and the step of laying the upper layer metal wiring, FeRAM is completed.

In the present embodiment, in the same manner as in the first embodiment, the barrier layer can be formed into a thin film, and the W plug 20 can effectively be prevented from being oxidized. It is possible to realize FeRAM including the COP type FeRAM cell which is high in the characteristics and reliability.

Moreover, also in the present embodiment, it is possible to use the material other than PZT of the capacitor dielectric film described in the first embodiment and the material other than platinum of the capacitor upper and lower electrode.

It is to be noted that the present invention is not limited to the above-described embodiments. For example, in the above-described embodiments, a memory cell including a structure in which the bit line is provided in the upper layer of the capacitor has been described. However, in order to further increase a degree of integration, the present invention can also be applied to the memory cell including a structure in which the capacitor is provided after forming the bit line.

Figure 7A:
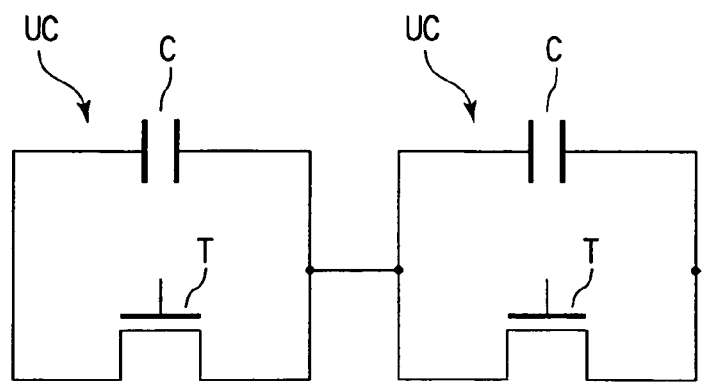
FIGS. 7A and 7B are an equivalent circuit diagram and sectional view showing another embodiment of the present invention.
Figure 7B:
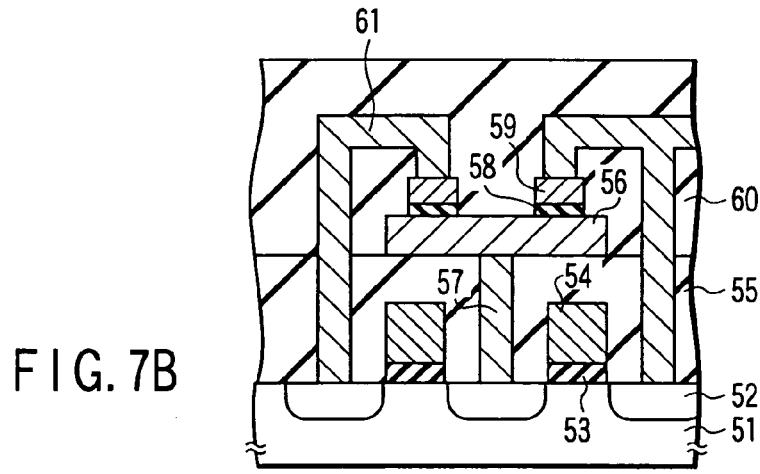
Figure 8:
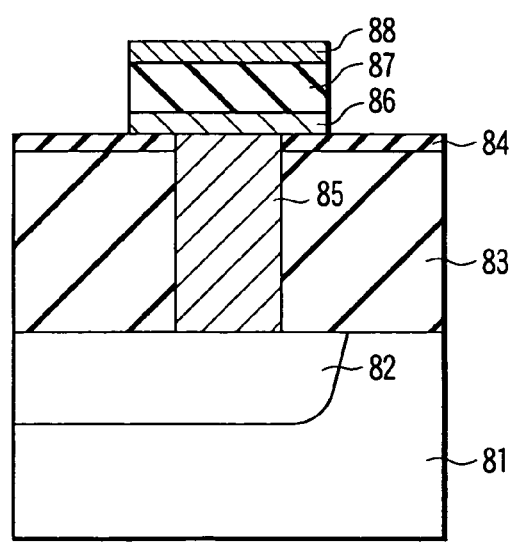
FIG. 8 is a sectional view showing a conventional COP structure.

Moreover, as shown in FIG. 7A, the present invention can also be applied a ferroelectric memory (TC juxtaposed unit series-connected ferroelectric memory) in which opposite ends of a capacitor (C) are connected between the source/drain of a cell transistor (T) to form a unit cell UC and a plurality of unit cells UC are connected in series. FIG. 7B shows a sectional view of the cell structure shown in FIG. 6A. In the drawing, 51 denotes a semiconductor substrate; 52 denotes a source/drain diffusion layer; 53 denotes a gate insulating film; 54 denotes a gate electrode; 55 denotes an interlayer insulating film; 56 denotes a capacitor lower electrode; 57 denotes a plug for connecting the capacitor lower electrode to one source/drain diffusion layer of the cell transistor T; 58 denotes a capacitor dielectric film formed of the ferroelectric material; 59 denotes a capacitor upper electrode; 60 denotes an interlayer insulating film; and 61 denotes a conductive plug for connecting the capacitor upper electrode to the other source/drain diffusion layer of the cell transistor T.

Furthermore, the present invention can also be applied to a stacked DRAM in which highly dielectric materials such as $Ta_2O_5$ and $(Ba,Sr)TiO_3$ are used in the capacitor dielectric film. Also in this case, an effect similar to that of the above-described embodiment is obtained with respect to a plug/capacitor structure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor device comprising:
   a semiconductor substrate;
   a conductive plug electrically connected to the semiconductor substrate and including Si;
   a flat electrically conductive silicon carbide film provided on the conductive plug;
   a capacitor comprising a lower flat electrode, a dielectric film on the lower flat electrode, and an upper electrode on the dielectric film, the lower flat electrode comprising a noble metal provided above the silicon carbide film; and
   an adhesive layer provided between the silicon carbide film and the lower flat electrode and the adhesive layer comprising a flat metal carbide film configured to adhere the silicon carbide film and the lower flat electrode.

2. The semiconductor device according to claim 1, wherein the conductive plug is electrically connected to an active region of a transistor provided on the surface of the semiconductor substrate.

3. The semiconductor device according to claim 2, wherein the metal carbide contains a carbide of titanium, zirconium, hafnium, vanadium, niobium, or tantalum.

4. The semiconductor device according to claim 3, wherein the adhesive layer further contains a compound of a metal contained in the metal carbide and silicon.

5. The semiconductor device according to claim 2, wherein the adhesive layer further contains a compound of a metal contained in the metal carbide and silicon.

6. The semiconductor device according to claim 1, wherein the metal carbide contains a carbide of titanium, zirconium, hafnium, vanadium, niobium, or tantalum.

7. The semiconductor device according to claim 6, wherein the adhesive layer further contains a compound of a metal contained in the metal carbide and silicon.

8. The semiconductor device according to claim 1, wherein the adhesive layer film further contains a compound of a metal contained in the metal carbide and silicon.

* * * * *